(12) United States Patent
Ma et al.

(10) Patent No.: US 6,656,329 B1
(45) Date of Patent: Dec. 2, 2003

(54) COATED PRESSING SURFACES FOR ABRASION RESISTANT LAMINATE AND MAKING LAMINATES THEREFROM

(75) Inventors: Muyuan M. Ma, Round Rock, TX (US); Jay T. Oliver, Belton, TX (US)

(73) Assignee: Premark RWP Holdings, Inc., Wilmington, DE (US)

( * ) Notice: Subject to any disclaimer, the term of this patent is extended or adjusted under 35 U.S.C. 154(b) by 0 days.

(21) Appl. No.: 09/337,768

(22) Filed: Jun. 22, 1999

Related U.S. Application Data

(63) Continuation-in-part of application No. 08/704,165, filed on Aug. 28, 1996, now Pat. No. 5,945,214.

(51) Int. Cl.$^7$ .............................................. C23C 14/06
(52) U.S. Cl. .................. 204/192.1; 425/406; 427/372.2
(58) Field of Search .................. 427/372.2; 204/192.1; 425/406

(56) References Cited

U.S. PATENT DOCUMENTS

| | | | |
|---|---|---|---|
| 3,798,111 A | * 3/1974 | Lane et al. .................. 161/162 |
| 3,802,078 A | 4/1974 | Denes |
| 4,019,873 A | 4/1977 | Reiter |
| 4,237,184 A | 12/1980 | Gonseth et al. |
| 4,367,110 A | 1/1983 | Yoshikawa |
| 4,395,452 A | 7/1983 | Scher et al. |
| 4,396,448 A | 8/1983 | Ohta et al. |
| 4,402,764 A | 9/1983 | Clark et al. |
| 4,411,960 A | 10/1983 | Mizuhara |
| 4,507,189 A | 3/1985 | Doi et al. |
| 4,512,175 A | 4/1985 | Kaku et al. |
| 4,532,149 A | 7/1985 | McHargue |
| 4,556,607 A | 12/1985 | Sastri |
| 4,590,031 A | 5/1986 | Eichen et al. |
| 4,619,865 A | 10/1986 | Keem et al. |
| 4,637,310 A | 1/1987 | Sato et al. |
| 4,657,729 A | 4/1987 | Bunch et al. |
| 4,689,102 A | 8/1987 | Prawdzik et al. |
| 4,713,138 A | 12/1987 | Ungar et al. |
| 4,820,392 A | * 4/1989 | Moskowitz et al. ... 204/192.11 |
| 4,957,884 A | 9/1990 | Knudsen et al. |
| 4,971,855 A | * 11/1990 | Lex et al. .................. 428/329 |
| 4,973,388 A | 11/1990 | Francois et al. |
| 4,993,058 A | 2/1991 | McMinn et al. |
| 5,024,901 A | 6/1991 | Garg et al. |
| 5,026,422 A | 6/1991 | Osborne |
| 5,032,242 A | 7/1991 | Knudsen et al. |
| 5,037,694 A | 8/1991 | Ungar et al. |
| 5,092,948 A | 3/1992 | Lange et al. |
| 5,114,750 A | 5/1992 | Howard |
| 5,182,256 A | 1/1993 | Itozaki et al. |
| 5,244,375 A | 9/1993 | Laurence et al. |
| 5,288,540 A | 2/1994 | Albrinck et al. |
| 5,306,531 A | 4/1994 | Laurence et al. |
| 5,308,367 A | 5/1994 | Julien |
| 5,334,302 A | 8/1994 | Kubo et al. |
| 5,453,168 A | 9/1995 | Nelson et al. |
| 5,455,197 A | 10/1995 | Ghanbari et al. |
| 5,618,388 A | 4/1997 | Seeser et al. |
| 5,656,364 A | 8/1997 | Rickerby et al. |
| 5,683,561 A | 11/1997 | Hollars et al. |
| 5,945,214 A | 8/1999 | Ma et al. |
| 5,968,596 A | * 10/1999 | Ma et al. ..................... 427/307 |

FOREIGN PATENT DOCUMENTS

| | | | |
|---|---|---|---|
| AT | 32557 | 2/1973 | |
| CA | 2213288 | 2/1998 | |
| EP | 0 548 760 | 6/1993 | ............. C23C/8/80 |
| EP | 674020 | 9/1995 | |
| EP | 826790 | 3/1998 | |
| FR | 2103432 A | 4/1972 | |
| JP | 54001308 | 1/1979 | |
| JP | 54158410 | 12/1979 | |
| JP | 55-2073 | 1/1980 | |
| JP | 62 077103 | 9/1987 | |
| JP | 11-246691 | 9/1999 | |
| NZ | 328553 | 1/1999 | |
| RU | 1477782 | 5/1989 | |

OTHER PUBLICATIONS

English abstract of DE 2141928.*
English abstract of JP 61034170.*
English abstract of JP 2703553.*
English abstract of JP 62077103.*
Spanish Search Report dated Dec. 1, 2000, which indicates the degree of relevance of the following cite as: Category A (the state of the technology); FR 2103432 A (CIBA–GEIGY et al.) Apr. 14, 1972, Abstract; p. 2, line 20; p. 3, line 9; p. 4, line 10; p. 5, line 29; Claims 1.2; Claims affected 1.9–11.
European Search Report dated Sep. 6, 2000.
Canadian Search Report filed Jun. 20, 2002, Canadian Intellectual Property Office.
"Surface Engineering for Wear Resistance", Budinaki, Kenneth G., pp. 316–321 no date.
"Crystaline TiB$_2$ Coatings Prepared by Ion–Beam–Assisted Deposition", Riviere, J.P. et al., pp. 151–161 no date.
"Growth, Structure and Stress of DC Megnetron Sputtered TiB$_2$ Thin Films", XP 002049332, Deng. H. et al., pp. 181–86 no date.
"Sputter Deposition of Wear–Resistant Coatings Within the System Zr–B–N", XP 002049333, Mitterer, C. et al., pp. 670–675 no date.

(List continued on next page.)

Primary Examiner—Archene Turner
(74) Attorney, Agent, or Firm—Fulbright & Jaworski L.L.P.

(57) ABSTRACT

A press plate for producing decorative laminate from resin impregnated paper, with alumina particles on its pressing surface, is coated with diborides selected from the group consisting of hafnium diboride, molybdenum diboride, tantalum diboride, titanium diboride, tungsten diboride, vanadium diboride, or zirconium diboride or mixtures thereof for making the press plate resistant to scratching. The preferred diborides are titanium and zirconium. The most preferred diboride is titanium. The color, gloss and surface appearance of laminate pressed with a titanium diboride coated press plate is substantially the same as laminate pressed with the press plate before coating.

47 Claims, No Drawings

OTHER PUBLICATIONS

"Reactive Sputtering of Titanium Boride", XP 000052937, Larsson, T. et al., pp. 133–140 no date.

"A Transmission Electron Microscopy Study on Sputtered Zr–B and Zr–B–N Films", XP 000261648, Brandstetter, E. et al., pp. 123–135 no date.

Eurpoean Search Report dated Dec. 19, 1997.

Patent Abstracts of Japan –216232 (no date).

Patent Abstracts of Japan –134658 (no date).

John Huminik, Jr., "High–Temperature Inorganic Coatings", Reinhold Publishing Corp., New York (date unknown).

Signapore Search Report, Jul. 9, 1999.

* cited by examiner

COATED PRESSING SURFACES FOR ABRASION RESISTANT LAMINATE AND MAKING LAMINATES THEREFROM

RELATED APPLICATIONS

The present application is a continuation-in-part of copending U.S. patent application Ser. No. 08/704,165, entitled "DIBORIDE COATED PRESSING SURFACES FOR ABRASION RESISTANT LAMINATE AND MAKING PRESSING SURFACES", filed Aug. 28, 1996, now U.S. Pat. No. 5,94,214 which application is hereby incorporated by reference. Reference is hereby made to copending U.S. patent application Ser. No. 09/026,166, entitled "DIBORIDE COATED PRESSING SURFACES FOR ABRASION RESISTANT LAMINATE AND MAKING PRESSING SURFACES", filed Feb. 19, 1998, which application is hereby incorporated by reference. Reference is also hereby made to copending U.S. patent application Ser. No. 09/001,146, entitled "METHOD FOR HIGH SCAN SPEED SPUTTER COATING TO PRODUCE COATED, ABRASION RESISTANT PRESS PLATES WITH REDUCED BUILT-IN THERMAL STRESS", filed Dec. 30, 1997, which application is also hereby incorporated by reference.

BACKGROUND

1. Field of the Invention

This invention relates to coated, abrasion resistant press plates used in making abrasion resistant decorative laminate, to the coating of press plates and to the making of laminate with these press plates. Grit, e.g., alumina particles, on the pressing surface of abrasion resistant decorative laminate can scratch press plates and reduce the visual quality of laminate thereafter made with the press plate. Press plates of this invention are particularly useful in making abrasion resistant high gloss decorative laminate.

2. Description of the Related Art

In the manufacture of decorative laminate, layers of resin impregnated paper are pressed against press plates under conditions of temperature and pressure to cure the resin and bond the layers together. A high gloss press plate imparts a high gloss surface to laminate. A textured surface imparts a textured surface to laminate. These press plates are extremely uniform, with even microscopic discontinuities being minimized. The quality of a high gloss polished press plate can be determined by viewing reflected images on its surface and scrutinizing the reflected images for optical discrepancies. Grit on the surface of laminate causes micro scratching of stainless steel press plates normally used in the manufacture of decorative laminate, thus destroying the micro finish of the press plate. Press plates can also be scratched by press plate handling equipment and by debris from pressing equipment or materials used in making laminate. (Laurence U.S. Pat. No. 5,244,375)

Melamine resin coated decorative laminate is pressed at temperatures of about 230–310° (110°–155° C.) and pressures of about 300–2000 psi (20–136 bar) and preferably about 750–1500 psi (51–102 bar). Heating to these temperatures and cooling to room temperature results in substantial expansion and contraction of the laminate and of the press plate. Expansion and contraction of the laminate and press plate will not be the same, resulting in the movement of grit on the pressing surface of laminate across the press plate.

It is disclosed in National Electrical Manufacturers Association (NEMA) Standards Publication No. LD 3, that gloss finish laminate has a gloss of 70–100+. High gloss textured finish laminate is disclosed as having a gloss of 21–40. Black glass with a gloss of 94+1, measured at an angle of 60 degrees, is disclosed as the NEMA Standard 3.2.2, for calibrating a gloss meter for 60 degree angle gloss measurements. 47526-PO24CP1–993 197 PATENT Even discontinuities in high gloss press plates that can only be seen with a microscope can impart visible surface defects to a high gloss surface of laminate. Any scratching of high gloss press plates imparts visible surface defects to high gloss surfaces of laminate and reduce gloss level.

Grit on the decorative surface of laminate imparts abrasion resistance, a commercially desirable characteristic of laminate. Particles of alumina are commonly used as grit in making decorative laminate. The Vickers hardness of alumina is disclosed in "Tribology: Friction and wear of Engineering Materials", I. M. Hutchings, CRC Press, 1992, to be 1800 to 2000. A useful range of particle sizes is about 10 to about 75 microns. Grit of about 25–60 microns is preferred. Optimum abrasion resistance is obtained in the particle size range of about 40 to 60 microns. (Lane et al. U.S. Pat. No. 3,798,111)

Alumina having a maximum particle size of 9 microns is disclosed as being effective for imparting a wear resistant surface to glossy decorative laminate. Wear resistance is defined as the resistance of a glossy laminate to loss of gloss when the surface of laminate is exposed to the abrasive effects of sliding objects. It is acknowledged that the resulting laminate does not meet NEMA LD 3.13 requirements to be considered as abrasion resistant. However, it is disclosed that glossy press plates are not scratched substantially if the grit particle size is maintained at less than 9 microns. (Lex et. al. U.S. Pat. No. 4,971,855).

The use of a 410 stainless steel press plate hardened by nitriding is disclosed for making high gloss decorative laminate. After pressing 100 sheets of high gloss laminate with 6 micron and 15 micron grit, the gloss of the pressed laminate remained good to very good. The nitrided press plate exposed to the 6 micron grit was rebuffed after 234 cycles and produced acceptable laminate quality for at least another 103 cycles. Nitrided press plates exposed to 30 micron grit offered limited durability. It is disclosed that the 410 stainless steel press plate used for nitrating had a Rockwell, "C" scale hardness of 38–45 and that the nitrided surface had a Rockwell, "C" scale hardness of 60–70. The equivalent Vickers hardness of 410 stainless steel is about 370–440, based on a conversion table published in "Metals Handbook, Mechanical Testing", Vol 8, 9th ed., ASM, 1985. The equivalent Vickers hardness of nitrided 410 stainless steel is about 500–1000, based on a conversion table published in "Metals Handbook, Mechanical Testing", Vol. 8, 9th ed., ASM, 1985. (Laurence U.S. Pat. No. 5,244,375)

Laminate with 35 micron average particle size alumina at its surface (PGA 822 overlay, available commercially from Mead Corporation) has been pressed with high gloss press plates coated with titanium nitride. After ten pressing, the titanium nitride coated press plates had about 15 scratches per square centimeter. A control 410 stainless steel press plate had about 500 scratches per square centimeter. The Vickers hardness of titanium nitride is disclosed in "Tribology: Friction and wear of Engineering Materials", I. M. Hutchings, CRC Press, 1992, to be 1200 to 2000.

The control press plate and the press plate on which the titanium nitride was coated were cut from the same stainless steel pressing plate. The scratches was visible under a light microscope at 40X magnification. Titanium nitride was coated onto 410 stainless steel high gloss press plates in a magnetron sputter coating system. The use of a magnetron sputter coating system for applying a titanium nitride coating is disclosed in "Multi-Cathode Unbalanced Magnetron Sputtering Systems," Sproul, Surface and coating Technology, 49 (1991). The use of a magnetron sputter coating system for cleaning the surface that is to be coated is disclosed in "A New Sputter Cleaning System For Metallic Substrates," Schiller et al., Thin Sold Films, 33 (1976).

Additionally, the color of the laminate pressed with the titanium nitride coated press plate was different than the color of the laminate pressed with the control press plate. An ASTM D 2244 color difference in comparison to a standard of less than (±0.5) ΔE is considered as an acceptable color match to the standard. The ASTM D 2244 color difference between a standard and laminate pressed with the titanium nitride coated press plate was greater than (0.5) ΔE. The titanium nitride coated press plate and laminate pressed therefrom bad a bronze appearance. The control press plate and the laminate pressed therefrom did not have a bronze appearance. Laminate pressed with the control press plate had an ASTM D 2244 color difference when compared with the standard of less than (0.5) ΔE.

Iron-based cutting tools have been sputter coated with 2–6 microns of titanium diboride. The sputtering is carried out in an argon or krypton beam of ions accelerated to 1300–1800 volts as a broad-beam ion source. A titanium diboride target is arranged as a cathode. The tool is heated to about 200° C.(392° F.). Sputtering is done under a vacuum of about 4–6 milli-Torr. Titanium diboride has an extremely high Vickers micro-hardness value, typically about 3600, which is not only considerably higher than other borides but also substantially higher than other carbides or nitrides. Titanium diboride is also particularly noted for its high density, e.g., 88% of theoretical density, a low resistivity of 30 micro-ohms centimeters, a high strength of about 40,000 psi, and a coefficient of thermal expansion which is about $8.1 \times 10^{-6}$ at the temperature range of 20°–800° C.(68–1472° F.). (oskowitz et al., U.S. Pat. No. 4,820,392).

Control conditions for sputter coating are disclosed in "Influence of Apparatus Geometry and Deposition Conditions on the Structure and Topography of Thick Sputtered 20 Coatings" Thornton, Journal of Vacuum Science Technology, Volume 11, Number 4, (July/August 1974) and "Sputtering" Thornton et al., Metal Handbook, Ninth Edition, American Society for Metals, Metals Park, Ohio 44073, Volume 5, pp 412–416, (1982).

There is a need for a hard coating on a press plates, continuous belt, and other pressing surfaces that imparts a color to laminate having an ASTM D 2244 color difference in comparison to a standard of less than (±.5) ΔE. There is a need for a coating that can be applied to a pressing surface without changing the appearance of the finish on the pressing surface. There is a need for a pressing surface that is not scratched when used in pressing laminate coated with alumina particles of greater than 10 microns and preferably greater than 25 microns. There is a particular need for a pressing surface that is not scratched when used in pressing high gloss laminate with an ASTM 2457 60 degree angle gloss of greater than 70, when the surface of the laminate is coated with 25–60 micron alumina particles.

SUMMARY OF THE INVENTION

It has now been discovered that the color, gloss and surface appearance of laminate made with pressing surfaces coated with diborides selected from the group consisting of hafnium diboride, molybdenum diboride, tantalum diboride, titanium diboride, tungsten diboride, vanadium diboride, or zirconium diboride or mixtures thereof are substantially the same as the color and gloss of laminate made with the pressing surfaces before the coating is applied. The preferred diborides for coating laminate pressing surfaces are titanium diboride or zirconium diboride. The most preferred diboride for coating laminate pressing surfaces is titanium diboride. It is believed that titanium diboride is more commonly used commercially for coating surfaces than other members of the diborides of this invention because it can be sputter coated in a magnetron sputtering system at a higher deposition rate.

The diboride coating of this invention can be applied on laminate pressing surfaces to have a Vickers hardness of at least 2000 and preferably at least 2200, sufficient for pressing laminate with 25–60 micron or larger alumina particles at the pressing surface of the laminate without being scratched. A coating of about 3 microns has sufficient hardness to resist scratching by alumina particles on the pressing surface of laminate. The hardness of the coating can be controlled in a planar magnetron sputter coating system by those skilled in the use of these systems.

It has been discovered that the diboride coating of this invention can be coated on a pressing surface with sufficient bond strength for use in pressing high pressure laminate. A minimum bond strength of 1.6 and preferably 1.8 kilogram force (kgf) determined by diamond scratching bond testing is believed sufficient. Diboride coatings of greater than 6 microns can have lower bond strengths due to stresses produced during coating.

Bonding of the diboride coating of this invention to the pressing surface is enhanced by thoroughly cleaning the pressing surface before introducing the pressing surface into a magnetron sputter coating system. Bonding is further enhanced by etching the pressing surface with the magnetron sputter coating system prior to applying the titanium diboride coating. Cleaning, anodic etching, cathodic etching and etching with radio frequency (RF) can be accomplished by methods known to those skilled in the use of a magnetron sputter coating system. It has been discovered that a layer of titanium applied directly onto the pressing surface before applying the diboride coating of this invention further enhances the bonding of the diboride. Improving bonding by cleaning, etching and the use of an intermediate layer between the coating and substrate are known to those skilled in the art of using magnetron sputter coating systems.

DETAILED DESCRIPTION

Black high gloss, high pressure laminate was pressed with titanium diboride coated press plates shown on Table 1. These press plates had been finished for imparting an ASTM D 2457 60 degree angle gloss of about 100 to laminate before being coated with titanium diboride. The ASTM D 2244 color difference between a standard and laminate pressed with the titanium diboride coated press plates shown on Table 1 was less than (0.5) ΔE. Gloss and color differences on Table 1, are averages of measurements made on 10 laminates.

TABLE 1

| | Gloss and Color Differences | |
|---|---|---|
| Press Plate | ASTM Gloss @ 60° | ASTM Color Difference, ΔE |
| 3000-1 | 101 | 0.20 |
| 3000-2 | 100 | 0.25 |

TABLE 1-continued

Gloss and Color Differences

| Press Plate | ASTM Gloss @ 60° | ASTM Color Difference, ΔE |
|---|---|---|
| 6000-1 | 101 | 0.35 |
| 6000-2 | 103 | 0.40 |
| 6000-3 | 102 | 0.30 |
| 6000-4 | 102 | 0.40 |
| 6000-5 | 103 | 0.45 |
| 6000-6 | 101 | 0.45 |

Additionally, high gloss Press Plate 3000-2 and a control press plate have been used in the pressing of 760 sheets of high pressure, black, high gloss laminate with 35 micron average particle size alumina particles on its pressing surface. Laminate was pressed with these press plates at about 1000 psi (68 bar) and 280° F. (138° C.). The pressing surface of the laminate is commercially available overlay sheet with 35 micron alumina grit (PGA 822 from Mead). Press Plate 3000-2 and the control press plate were cut from a high gloss, 410 stainless steel press plate that had been finished for imparting an ASTM D 2457 60 degree angle gloss of about 100 to laminate. Press Plate 3000-2 and the control press plate measure about twelve inches along one side and eleven inches along their other side. Press Plate 3000-2 was coated with about five microns of titanium diboride in a magnetron sputter coating system. The titanium diboride coating was applied in 17 scans, applying about 3000 angstroms of titanium diboride per scan. The other was used as a control.

The first sheet of black, high gloss laminate with 35 micron average particle size alumina particles on its pressing surface pressed with the control press plate had an ASTM D 2244 color difference in comparison to a standard of about (0.25) ΔE. The first sheet of black, high gloss laminate pressed with Press Plate 3000-2 had an ASTM D 2244 color difference in comparison to a standard of about (0.15) ΔE.

The first sheet of black laminate pressed with the control press plate had an ASTM D 2457 60 degree angle gloss of about 100 to laminate. The 760th sheet of black laminate pressed with the control press plate had an ASTM D 2457, 60 degree angle gloss of less than 70. The control press plate imparted a 60 degree angle gloss of less than 90 to black laminate after it had pressed about 160 sheets. It is believed that laminate with a 60 degree angle gloss of less than 90 is not commercially acceptable as a high gloss laminate.

These 760 sheets of black laminate pressed with Press Plate 3000-2 had an ASTM D 2457 60 degree angle gloss of about 100. Press Plate 3000-2 has been viewed under a microscope for scratches after pressing these 760 sheets of black laminate and none have been found. The control press plate is heavily scratched.

No differences were observed in the surface appearance of laminate pressed with the Press Plates shown on Table 1 and control press plates.

Titanium diboride was coated onto the high gloss press plate in a magnetron sputter coating system under a number of conditions. It is also believed that a coating of at least 3 microns is necessary for achieving a Vickers hardness of at least 2000 and that adhesion decreases at coating thicknesses of 6 microns or greater. Hardness and adhesion can be controlled, as known to those skilled in the art, by the pressure and temperature under which press plates are coated with the diborides of this invention and the power (amperes and volts) used in coating the diborides of this invention on press plates.

A textured press plate coated with titanium diboride, hereinafter "Press Plate 3000-3", and a control press plate been used in the pressing of greater than 450 sheets of high pressure, black, textured laminate with 35 micron average particle size alumina particles on its pressing surface. This laminate was pressed at about 1000 psi (68 bar) and 280° F. (138° C.). Press Plate 3000-3 and the control press plate were cut from a textured, 630 stainless steel press plate that had been finished for imparting an ASTM D 2457 60 degree angle gloss of about 10 to laminate. Press Plate 3000-3 and the control press plate measure about twelve inches along each side. Press Plate 3000-3 was coated with about six microns of titanium diboride in a magnetron sputter coating system. The titanium diboride coating was applied in 20 scans, applying about 3000 angstroms of titanium diboride per scan.

The first sheet of this black, textured laminate pressed with the control press plate had an ASTM D 2244 color difference in comparison to a standard of about (0.22) ΔE. Black, high gloss laminate pressed with Press Plate 3000-3 had an ASTM D 2244 color difference in comparison to a standard of about (0.08) ΔE.

The first sheet of this black laminate pressed with the control press plate had an ASTM D 2457, 60 degree angle gloss of about 9.5. The 450th sheet of this black laminate pressed with the control press plate had an ASTM D 2457, 60 degree angle gloss of about 8. This black laminate pressed with Press Plate 3000-3 had an ASTM D 2457, 60 degree angle gloss of about 10.

No differences were observed in the surface appearance of laminate pressed with the Press Plate 3000-3 and a control press plate.

The press plates on Table I and Press Plate 3000-3 were cleaned and then etched under radio frequency conditions in a planar magnetron sputter coating system. These press plates were then coated with titanium diboride in the magnetron sputter coating system under the following averaged conditions.

| Cleaning | |
|---|---|
| chemical cleaning | wipe with ethanol, trichloroethane and acetone |
| physical cleaning | 5 minute nitrogen gas blow over press plate |
| Radio Frequency Etching Conditions | |
| gas medium | argon |
| in./minute(cm./minute) scan speed | 1(2.54) |
| mTorr | 10 |
| MA/sq. in. (mA/sq. cm.) | 3.5(.54) |
| kV | .75 |
| Titanium Diboride Coating Conditions | |
| gas medium | argon |
| in./minute (cm./minute) scan speed | 1(2.54) |
| mTorr | 7 |
| mA/sq. in. (mA/sq. cm.) | 83(13) |
| kV | .3 |

| Press Plate | Scan Rate Å/scan | Scans | Thickness microns | Adhesion kgf | Hardness HV |
|---|---|---|---|---|---|
| 3000-1 | 3000 | 14 | 4.2 | 1.7 | 2280 |
| 3000-2 | 3000 | 17 | 5.1 | 2.1 | 2830 |

-continued

| Press Plate | Scan Rate Å/scan | Scans | Thickness microns | Adhesion kgf | Hardness HV |
|---|---|---|---|---|---|
| 3000-3 | 3000 | 20 | 5.5 | 2.0 | 2700 |
| 6000-1 | 6000 | 6 | 3.7 | 1.8 | 1940 |
| 6000-2 | 6000 | 6 | 3.7 | 1.8 | 2160 |
| 6000-3 | 6000 | 7 | 4.4 | 1.8 | 2250 |
| 6000-4 | 6000 | 7 | 4.3 | 2.0 | 2190 |
| 6000-5 | 6000 | 10 | 6 | 2.2 | 2880 |
| 6000-6 | 6000 | 10 | 6 | 2.0 | 2850 |

Three high gloss press plates, measuring about four feet by eight feet, of this invention have been made. These press plates are referred to as Press Plates 3-1, 3-2, and 3-3. These press plates were sputter coated with titanium diboride under planar magnetron discharge conditions.

Press Plates 3-1, 3-1, and 3-3 were anodically etched and then coated with titanium and titanium diboride in a planar magnetron sputter coating system under the following average conditions. These press plates were chemically cleaned before they were placed into the sputter coating system. The temperature of these press plates during etching and coating was about 300° F. (149° C.). These press plates did not warp at this temperature.

| Cleaning (Press Plates 3-1, 3-2, and 3-3) | | | |
|---|---|---|---|
| chemical cleaning | wipe with ethanol, trichloroethane and acetone | | |
| | (Press Plates | | |
| | 3-1 | 3-2 | 3-3) |
| Anodic Etching Conditions | | | |
| gas medium | argon | argon | argon |
| in./minute (cm./minute) scan speed | 3(7.6) | 3(7.6) | 3(7.6) |
| mTorr | 25 | 24 | 10 |
| mA/sq. in. (mA/sq. cm.) | 4.6(.72) | 2.9(.45) | 2.9(.45) |
| kV | .24 | .23 | .24 |
| number of scans | 1 | 1 | 5 |
| Titanium Coating Conditions | | | |
| gas medium | argon | argon | argon |
| in./minute (cm./minute) scan speed | 3(7.6) | 3(7.6) | 3(7.6) |
| mTorr | 1.6 | 1.2 | 2.7 |
| mA/sq. in. (mA/sq. cm.) | 71(11) | 75(12) | 70(11) |
| kV | .52 | .60 | .50 |
| number of Ti scans | 1 | 1 | 1 |
| Titanium Diboride Coating Conditions | | | |
| gas medium | argon | argon | argon |
| in./minute (cm./minute) scan speed | 3(7.6) | 3(7.6) | 3(7.6) |
| mTorr | 1.6 | 1.2 | 2.7 |
| mA/sq. in. (mA/sq. cm.) | 71(11) | 75(12) | 70(11) |
| kV | .52 | .60 | .50 |
| number of $TiB_2$ scans | 8 | 12 | 18 |
| deposition rate (Å/scan) | 4125 | 5500 | 3000 |
| Properties of $TiB_2$/Ti Coating | | | |
| thickness (microns) | 3.3 | 6.6 | 5.4 |
| adhesion (kgf) | * | 1.2* | ** |
| hardness (kgf) | 2000 | 2500 | ** |

*$TiB_2$/Ti coating separated from Press Plates 3-1 and 3-2 during the pressing of laminate.
**The hardness and adhesion of Press Plate 3-3 has not been measured. Hardness and adhesion testing destroys the surface of a press plate.

Press Plate 3-3 has been used in the pressing of greater than 1200 sheets of high pressure, black, high gloss laminate with 35 micron average particle size alumina particles on their pressing surfaces. Press Plates 3-3 was viewed for scratches after pressing these 1200 sheets of laminate and none have been found. The titanium diboride coating on Press Plates 3-1 and 3-2, separated from the stainless steel substrate after pressing less than 100 sheets of laminate.

A zirconium diboride coated high gloss press plate of this invention and a control press plate have each been used in the pressing of 10 sheets of black, high gloss laminate. This laminate had an ASTM D 2244 color difference in comparison to a standard of about (0.26) ΔE and an ASTM D 2457, 60 degree angle gloss of about 100. No differences were observed in the surface appearance of laminate pressed with the zirconium coated and control press plates.

A zirconium diboride coated high gloss press plate of this invention has been used in the pressing of 10 sheets of black, high gloss laminate with 35 micron average particle size alumina particles on its pressing surface. This laminate was pressed at about 1000 psi (68 bar) and 280° F. (138° C.). A commercially available overlay sheet with 35 micron alumina grit (PGA 822 from Mead) is the pressing surface of the laminate. No scratches were observed on this press plate after the pressing of these 10 sheets of laminate.

This zirconium diboride press plate was cut from a high gloss, 410 stainless steel press plate having an ASTM D 2457, that had been finished for imparting a 60 degree angle gloss of about 100 to laminate. Two press plates measuring about twelve inches along each side were cut from this press plate. One was coated with about five microns of zirconium diboride in a planar magnetron sputter coating system. This press plate was etched under radio frequency conditions for about 15 minutes before the titanium diboride coating was applied. A 6 micron zirconium diboride coating was applied in 15 scans, applying about 4,000 angstroms of zirconium diboride per scan in a planar magnetron sputter coating system under the following averaged conditions.

| Cleaning | |
|---|---|
| chemical cleaning | wipe with ethanol, trichloroethane and acetone |
| physical cleaning | 5 minute nitrogen gas blow over press plate |
| Radio Frequency Etching Conditions | |
| gas medium | argon |
| in./minute (cm./minute) scan speed | 1(2.54) |
| mTorr | 10 |
| mA/sq. in. (mA/sq. cm.) | 3.5(.54) |
| kV | .75 |
| Zirconium Diboride Coating Conditions | |
| gas medium | argon |
| in./minute (cm./minute) scan speed | 1(2.54) |
| mTorr | 7 |
| mA/sq. in. (mA/sq. cm.) | 56(9) |
| kV | 4 |

Black, laminate has been pressed with press plates, measuring six inches by six inches (15.24 cm×15.24 cm), coated with titanium nitride in a magnetron sputter coating system. The test results shown on Table 3 are the average results of pressing five sheets of laminate with each press plate.

TABLE 4

Laminate Pressed With Titanium Nitride Coated Press Plates

| | control #8 | TiN #8 | control #9 | TiN #9 |
|---|---|---|---|---|
| ASTM Gloss @ 60° | 100 | 95 | 100 | 95 |
| ASTM Color Difference, ΔE | 0.30 | 0.75 | 0.35 | 0.90 |

The gloss of the laminate pressed with the titanium nitride coated press plate was lower than the gloss of laminate pressed with the control press plate. The color of the laminate pressed with the titanium nitride coated press plate was significantly different from the color of the laminate pressed with the uncoated control press plate. The titanium nitride coated press plates and laminate pressed with the titanium nitride press plates had a bronze appearance.

Black, laminate has been pressed with press plates, measuring six inches by six inches (15.24 cm×15.24 cm), coated with niobium nitride in a magnetron sputter coating system. The test results shown on Table 4 are the average results of pressing five sheets of laminate with each press plate.

TABLE 5

Laminate Pressed With Niobium Nitride Coated Press Plates

| Black High Gloss Laminate | control | B3 (3 $\mu$m) | B5 (5 $\mu$m) |
|---|---|---|---|
| ASTM Gloss @ 60° | 106 | 102 | 101 |
| ASTM Color Difference, $\Delta$E | 0.09 | 0.65 | 0.85 |

The gloss of laminate pressed with niobium nitride coated press plates was lower than the gloss of laminate pressed with the press plate before it was coated. The color of laminate pressed with the niobium nitride coated press plates was significantly different from laminate pressed with press plates before they were coated.

Black, laminate has been pressed with press plates, measuring six inches by six inches (15.24 cm×15.24 cm), coated with diamond like coating in a magnetron sputter coating system. The laminate stuck to the diamond like coated press plate and was destroyed when it was separated.

While the illustrative embodiments of the invention have been described with particularity, it will be understood that various other modifications will be apparent to and can be readily made by those skilled in the art without departing from the spirit and scope of the invention. Accordingly, it is not intended that the scope of the claims appended hereto be limited to the examples and descriptions set forth herein but rather that the claims be construed as encompassing all the features of patentable novelty that reside in the present invention, including all features that would be treated as equivalents thereof by those skilled the art to which this invention pertains.

What is claimed is:

1. A method of making a durable laminate, comprising:
   assembling a stack comprising at least one resin impregnated layer, wherein said resin impregnated layer is provided with an amount of a first substance adapted to at least in part provide a desired durable characteristic to said laminate;
   positioning a press plate adjacent to said at least one resin impregnated layer with a surface of said press plate in contact with a first surface of said at least one resin impregnated layer, wherein said surface of said press plate has been coated with a second substance adapted to provide enhanced resistance to degradation of said press plate due to interfacing with said first substance, wherein said second substance has been further adapted not to transfer an undesirable color to said resin impregnated layer when said surface of said press plate engages said first surface of said at least one resin impregnated layer; and
   applying said surface of said press plate coated with said second substance to said first surface of said resin impregnated layer.

2. The method of claim 1, wherein said first substance is alumina particles of size 35 microns.

3. The method of claim 1, wherein said press plate is applied to said resin impregnated layer to provide a desired finish to said durable laminate.

4. The method of claim 3, wherein said desired finish is a gloss finish.

5. The method of claim 3, wherein said desired finish is a textured finish.

6. The method of claim 3, wherein coating of said surface of said press plate with said second substance is adapted to maintain said finish on said press plate after repeated applications to resin impregnated layers having said first substance.

7. The method of claim 3, wherein coating of said surface of said press plate with said second substance is adapted to maintain said finish on said press plate after repeated applications to at least eleven resin impregnated layers having said first substance.

8. The method of claim 1, wherein said press plate is applied to said resin impregnated layer to transfer a desired characteristic of said surface of said press plate to said resin impregnated layer.

9. The method of claim 1, wherein said second substance comprises titanium diboride.

10. The method of claim 1, wherein said second substance comprises a diboride selected from the group consisting of hafnium diboride, molybdenum diboride, tantalum diboride, tungsten diboride, vanadium diboride, and zirconium diboride.

11. The method of claim 1, further comprising:
    applying heat and pressure to said stack and said press plate to cure said resin impregnated layer.

12. The method of claim 1, wherein said surface of said press plate has been coated with a second substance by sputter coating.

13. The method of claim 12, wherein said sputter coating has been done at a speed selected at least in part to prevent warping of said press plate.

14. The method of claim 12, wherein said sputter coating has been done in multiple layers to at least in part prevent warping of said press plate.

15. The method of claim 1, wherein said second substance is a substance capable of being sputter coated at a higher deposition rate than other substances utilized to provide a protective coating.

16. The method of claim 1, wherein said first substance is capable of being coated on said press plate with a desired bond strength.

17. The method of claim 1, wherein said coating of said second substance has a thickness between 3 and 6 microns.

18. A method of making a durable laminate, comprising:
    sputter coating a surface of a press plate with a first substance that provides enhanced resistance to degradation of said press plate due to interfacing with a second substance, wherein said coating is done at a speed selected to at least in part prevent warping of said press plate;
    positioning said press plate adjacent to a laminate material comprising at least a first layer with said surface of said press plate in contact with a first surface of said first layer, wherein an amount of said second substance is provided to said first layer to at least in part provide a durable characteristic to said laminate; and
    applying said press plate to said first surface to provide a desired characteristic to said first surface.

19. The method of claim 18, wherein a characteristic of said surface of said press plate is transferred to said first surface in said applying step.

20. The method of claim 19, wherein said characteristic of said surface of said press plate is transferred to said first surface without also transferring an undesirable color characteristic of said surface of said press plate.

21. The method of claim 18, wherein said desired characteristic to be provided to said first surface is a desired gloss finish.

22. The method of claim 18, wherein said desired characteristic to be provided to said first surface is a desired texture finish.

23. The method of claim 18, wherein said first layer is a resin impregnated paper layer.

24. The method of claim 18, wherein said first substance comprises a diboride.

25. The method of claim 18, wherein said laminate has an ASTM D 2244 color difference of less than (0.5) ΔE in comparison to a standard laminate.

26. The method of claim 25, wherein said standard laminate has been made by applying a press plate to a laminate material, wherein said press plate has not been coated with said first substance.

27. The method of claim 18, wherein said coating has been done in multiple layers to at least in part prevent warping of said press plate.

28. The method of claim 18, wherein said first layer is an overlay sheet and said second substance is 35 micron alumina grit.

29. The method of claim 18, wherein said first substance is a substance capable of being sputter coated at a higher deposition rate than other substances utilized to provide a protective coating.

30. The method of claim 18, wherein said first substance is capable of being coated on said press plate with a desired bond strength.

31. The method of claim 30, wherein said desired bond strength is 1.6 kilogram force (kgf).

32. The method of claim 18, further comprising:
    selecting a size of particles of said second substance to provide said durable characteristic to said laminate.

33. The method of claim 18, wherein the thickness of said coating of said first substance is between 3 and 6 microns.

34. A method of making a press plate for producing a laminate, comprising:
    coating a first surface of said press plate with a first substance to provide enhanced resistance to degradation of said press plate due to interfacing with a second substance provided to a first layer, wherein said first substance is adapted not to transfer an undesirable color to said first layer due to said interfacing.

35. The method of claim 34, wherein said first substance comprises a diboride.

36. The method of claim 34, further comprising:
    selecting a desired thickness of said coating of said first substance to provide a desired hardness to resist scratching by said second substance.

37. The method of claim 36, wherein said coating has a thickness of not greater than 6 microns.

38. The method of claim 34, wherein said first substance comprises titanium diboride.

39. The method of claim 34, wherein said first substance comprises a diboride selected from the group consisting of hafnium diboride, molybdenum diboride, tantalum diboride, tungsten diboride, vanadium diboride, and zirconium diboride.

40. The method of claim 34, further comprising:
    imparting a desired finish to said first surface of said press plate prior to coating said first surface of said press plate.

41. The method of claim 34, wherein said coating step further comprises the step of:
    selecting an amount of said first substance to be applied to said first surface.

42. The method of claim 34, wherein said coating step comprises:
    sputter coating said pressing surface in multiple scans with a predetermined amount of said first substance being applied in each scan, thereby preventing warping of said press plate.

43. The method of claim 34, wherein said second substance is alumina grit of at least size 35 microns.

44. The method of claim 34, wherein said first layer is a melamine resin impregnated paper layer.

45. The method of claim 34, further comprising:
    controlling a hardness of said press plate by selecting a pressure and temperature under which said press plate is coated.

46. The method of claim 34, wherein a pressure and temperature under which said press plate is coated is controlled to provide a Vickers hardness of at least 2000 to said press plate.

47. The method of claim 34, wherein a desired hardness of said press plate depends in part on a particle size of said second substance.

* * * * *